Figure 1:
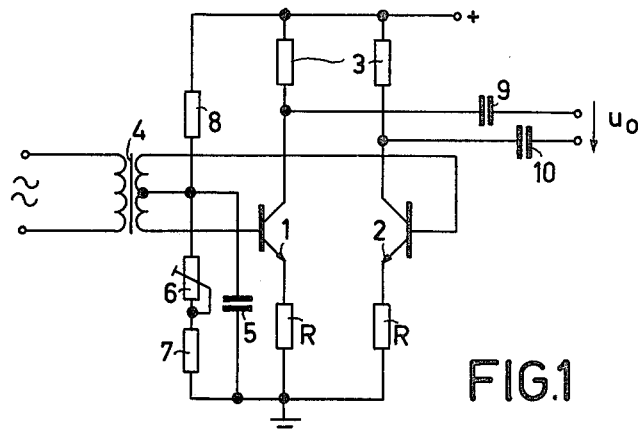

United States Patent [19]

Berger

[11] 4,287,478
[45] Sep. 1, 1981

[54] AMPLIFIER ARRANGEMENT COMPRISING TWO TRANSISTORS

[75] Inventor: Hermann Berger, Innsbruck, Austria

[73] Assignee: U.S. Philips Corp., New York, N.Y.

[21] Appl. No.: 28,481

[22] Filed: Apr. 9, 1979

[30] Foreign Application Priority Data

Apr. 29, 1978 [DE] Fed. Rep. of Germany ....... 2819087

[51] Int. Cl.³ .......................... H03F 3/30; H03F 3/45
[52] U.S. Cl. .................................... 330/256; 330/261; 330/272; 330/301
[58] Field of Search ............... 330/256, 261, 272, 289, 330/301

[56] References Cited

U.S. PATENT DOCUMENTS

| | | | |
|---|---|---|---|
| 3,466,630 | 9/1969 | Mayne et al. | 330/261 X |
| 3,506,926 | 4/1970 | Shoemaker | 330/261 X |
| 3,757,239 | 9/1973 | Langan | 330/256 X |
| 4,087,758 | 5/1978 | Hareyama | 330/261 |

FOREIGN PATENT DOCUMENTS 800506 8/1958 United Kingdom ..................... 330/272

OTHER PUBLICATIONS

Karlsson, "On a Temperature Stabilized Wideband Operational Amplifier", Nuclear Instruments And Methods, vol. 96, No. 3, 1971, pp. 387–395.

*Primary Examiner*—James B. Mullins
*Attorney, Agent, or Firm*—William J. Streeter; Bernard Franzblau

[57] ABSTRACT

A symmetrical amplifier comprising two transistors having their emitters connected to ground via two resistors of equal value. An input signal is applied between the bases of the transistors and an output signal is available at the collectors of the transistors. This amplifier will provide improved linearity up to an input voltage of 200 mV if, for the emitter resistor, the relationship $R \approx 0.56\ U_T/I_{CO}$ is satisfied, $U_T$ being the thermal voltage and $I_{CO}$ the collector quiescent current. The value of this resistor is very small so that the slope is reduced only slightly by the emitter resistors and the sensitivity of the circuit is hardly affected thereby.

11 Claims, 5 Drawing Figures

AMPLIFIER ARRANGEMENT COMPRISING TWO TRANSISTORS

The invention relates to an amplifier arrangement comprising two transistors having base electrodes to which the input signal is applied in phase opposition, collector electrodes at which the output signal is available, and emitter electrodes connected to a symmetrical resistor network.

Such an arrangement is known (for example U.S. Pat. No. 3,413,492). In this case the resistor network is constituted by two resistors which are connected to a point of constant potential via a constant-current source.

When such a transistor amplifier is energized from a low ohmic source, i.e. from a signal voltage source whose internal resistance is low in comparison with the input resistance of the amplifier, a non-linear relationship results between the input voltage applied to the bases of the two transistors and the output signal available at the collectors, while the collector current of each of the two transistors approximates an upper limit value which corresponds to the current supplied by the current source. This non-linearity and the resultant signal distortion increases as the input signal increases.

It is known that distortion can be reduced by negative feedback. However, this also leads to a reduction in gain. If such an amplifier arrangement is used as a receiver input circuit, the negative feedback improves the operation for larger signals owing to the reduced distortion, but the operation for smaller signals deteriorates as a result of the negative feedback because the noise of the circuit then becomes more conspicuous as a result of the reduction in gain.

Furthermore it is known that transistor amplifiers exhibit a highly linear relationship between input and output current because there is a linear relationship between the collector current and the base current (but not between the base-emitter voltage and the collector current). In order to utilize this linear relationship, the signal current should be applied from a high ohmic source, i.e. the internal resistance of the signal voltage source should be high in comparison with the input resistance of the amplifier arrangement, so that a substantial portion of the signal power is lost in the internal resistance of the high-ohmic signal source. Moreover, the high internal resistance of the signal source in combination with the inevitable input capacitances of the transistor amplifier act as a low-pass filter to attenuate the higher signal frequencies.

It is an object of the present invention to provide an amplifier arrangement which, when driven by a low-ohmic signal source, can also handle large signals substantially distortion-free and without the signal gain being significantly reduced.

Starting from an amplifier arrangement of the type mentioned in the preamble, this object is achieved in accordance with the invention in that the resistor network connects the emitter electrodes to a point of constant potential and is proportioned so that the slope of each of the two transistors is a factor a smaller than the value $I_{CO}/U_T$, where $I_{CO}$ is the collector quiescent current of such a transistor, $U_T$ is the thermal voltage and a is a factor between 0.47 and 0.78, but preferably between 0.57 and 0.70. In this respect slope is to be understood to mean the quotient of the collector signal current of the transistor and the input signal of this transistor for low input signal amplitudes, which signal appears between the base and the point of constant potential (although the circuit can also be operated at very high input signal amplitudes, as will be explained hereinafter). The transistors should then have an exponential relationship between collector current and base-emitter voltage, which is generally the case with bipolar transistors. The collector quiescent current $I_{CO}$ is then defined as the direct current which flows through each of the two transistors if no input signal is applied. The thermal voltage $U_T$, as is known, follows from the equation $U_T = kT/q$, where k is Boltzman's constant, T the absolute temperature and q the elementary charge. The thermal voltage $U_T$ is approximately 25.2 mV at room temperature. The transistors are operated symmetrically in respect of direct current.

In such a circuit a good linearity is obtained between the input voltage and the difference of the collector currents. If this linearity is to be utilized, the input signal should be applied so that the input voltage, i.e. the voltage between the base electrodes, respectively between each of the two bases and the point of constant potential, is not distorted. This means that the signal should be applied from a low-ohmic source. Moreover, the base current supply should also have a low internal resistance.

In accordance with a further embodiment of the invention an optimum setting is obtained when the factor a is approximately 0.64. In the simplest case the resistor network can be realized by means of respective resistors connected between the emitters of the transistors and the point of constant potential. As is known, the slope S of a transistor with a resistor R in the emitter circuit can be calculated by means of the formula $$S = S_O/(1 + S_O R)$$

where $S_O$ is the slope in the case where no emitter resistor is included. As is known, the formula $S_O = I_{CO}/U_T$ is then valid. Thus, in accordance with the invention, the following equation should be valid:
$S = aS_O = S_O/(1 + S_O R)$.

It follows that:

$R = (1-a)/aS_O$, or $R = (1-a)U_T/aI_{CO}$.

When a is proportioned in accordance with the invention, then the emitter resistance R should lie between 0.28 $U_T/I_{CO}$ and 1.12 $U_T/I_{CO}$, preferably between 0.42 $U_T/I_{CO}$ and 0.75 $U_T/I_{CO}$, the optimum value being situated at approximately 0.56 $U_T/I_{CO}$, i.e. that between the emitters of the transistors and the point of constant potential a resistor is included whose value is at least approximately 0.56 $U_T/I_{CO}$. At a collector quiescent current of 1 mA per transistor, the distortion is then minimal if resistors of approximately 14 ohms are included in each emitter circuit.

Figure 2:
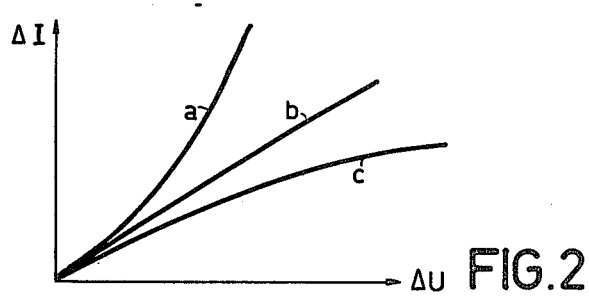
Figures 3, 4:
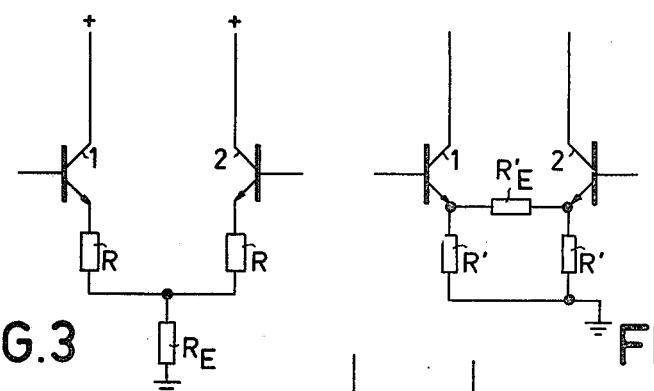
Figure 5:
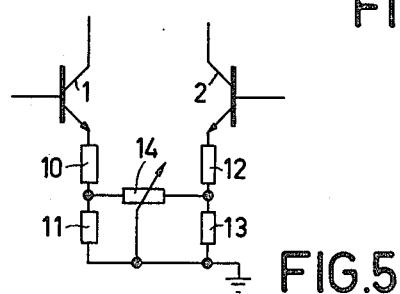

The invention will now be described in more detail with reference to the drawing which shows several embodiments thereof. In the drawing:

FIG. 1 shows the circuit diagram of a circuit arrangement in accordance with the invention, FIG. 2 represents the dependence of the collector current difference on the voltage between the bases of the transistors, and FIGS. 3 to 5 show modifications of the arrangement in accordance with FIG. 1.

The circuit comprises two transistors 1 and 2 having emitter electrodes connected to ground via two resistors R of equal value. The collector electrodes are each connected to the positive terminal of a supply voltage source, not shown, via a resistor 3. The two collector resistors are also of the same value. The signal voltage is applied to the bases of the transistors 1, 2 via a transformer 4 having a secondary winding with its ends connected to the base of the transistors and which comprises a centre tapping connected to ground via a capacitor 5 which constitutes a short-circuit for signal frequencies. Thus, half the signal voltage induced in the secondary of the transformer 4 appears between the base of each of the two transistors and ground. The base direct currents of the two transistors are obtained by means of a voltage divider which comprises a resistor 8, which is included between the positive terminal of the supply voltage source and the centre tapping of the secondary of the transformer, a variable resistor 6 which is connected to the centre tapping of the secondary of the transformer, and a resistor 7 which is connected in series therewith and with its other end connected to ground. The operating points of the transistors 1, 2, which preferably have the same characteristic, are adjusted by means of the voltage divider 6 . . . 8 in such a way that the desired collector quiescent current is obtained.

In combination with the low-ohmic voltage divider 6 . . . 8 this ensures that the voltage at the base electrodes of the transistors 1 and 2 corresponds to the signal voltage at the primary of the transformer 4 without any distortion, while the base current may still exhibit distortion. The output signal $U_O$, which is proportional to the collector current difference, is available via two capacitors 9 and 10, which are connected between the junctions of the resistors 3 and the collectors of the transistors 1 and 2 on the other hand. The collector current difference can also be processed in a different manner. For example, the two collector currents may be applied directly to the two emitter connection points of two cross-coupled differential amplifier pairs. When a further signal voltage or an oscillator signal is applied to the base electrodes of these differential amplifier pairs, a mixing stage is obtained.

When it is assumed that a relationship in accordance with the formula $I_C = I_O \exp(U/U_T)$ exists between the base-collector voltage of each of the two transistors 1 and 2 and the collector current $I_{CO}$ of these transistors, $I_C$ being the collector current, $I_O$ the collector quiescent current, U the voltage between base and emitter, and $U_T$ the thermal voltage (approximately 25 mV), the difference $\Delta I$ of the collector currents may be represented by the curve a of FIG. 2, which shows the variation as a function of the voltage $\Delta U$ between the bases of the transistors 1 and 2, if the emitter resistors have the values R=0.

However, if the values of the emitter resistors R have been selected so that the voltage drop produced across them is high relative to the thermal voltage, the variation in accordance with the curve c is obtained. At a value $R = 0.56\, U_T/I_{CO}$ the linear relationship designated b in FIG. 2 is obtained up to an input voltage amplitude of $\Delta U = 200$ mV. $I_{CO}$ is then the collector quiescent current, i.e. the collector current which flows through each of the transistors 1, 2 if the voltage between the bases is $\Delta U = 0$. For this dimensioning a comparatively smaller direct voltage drop (at $\Delta U = 0$ only approx. 14 mV) is produced across resistor R. This means that the slope or the gain is also reduced slightly, i.e. to approximately 64% of the value which it would have without an emitter resistor.

In practice the inevitable base-junction resistance of a transistor causes its slope to be slightly smaller than the theoretical value $I_{CO}/U_T$. However, this effect can at least partly be compensated for by a reduction of R; it decreases according as the base current of the transistor decreases and according as the base-junction resistance increases. It may be neglected if the voltage drop across the base-junction resistance is small in comparison with the voltage drop across the resistor R, i.e. small in comparison with 0.56 $U_T$.

The circuit proportioned in accordance with the invention thus ensures a linear gain even at higher input voltages and without the gain and thus the signal-noise ratio deteriorating significantly at lower amplitudes.

The results of this calculation are confirmed by measurements of the amplitude of the third harmonic of the signal applied to the input. Even harmonics do not occur in a circuit arrangement in accordance with FIG. 1 in the case of a symmetrical arrangement because they cancel each other in such a push-pull arrangement. The higher odd harmonics have hardly any influence on the distortion so that allowance has to be made mainly for the third harmonic. At a transistor quiescent current $I_{CO}$ of 0.5 mA in the absence of emitter resistors R and at an effective value of the collector alternating current difference of 0.76 mA an attenuation $a_3$ of third-order harmonics of −20 dB was measured. When emitter resistors of 14 ohms were used ($= 0.28\, U_T/I_{CO}$) a harmonic damping $a_3$ of −33 dB was measured (at the same collector-current difference). The same harmonic damping was obtained when emitter resistors of 56 ohms (32 1.12 $U_T/I_{CO}$) were used. When 27 ohm emitter resistors ($= 0.54\, U_T/I_{CO}$) were used, the harmonic damping increased to −47 db. This means that for a collector-current difference whose amplitude (1.07 mA) is greater than the sum of the quiescent currents of the two transistors, the effective value of the third order harmonics was not even a half per cent of the effective value of the fundamental wave. When emitter resistors of 27 ohms were used at a collector quiescent current of 0.5 mA, the harmonic damping was still 35 db, even at an amplitude of the collector current difference of 5.4 mA. At these amplitudes of the collector currents, which exceed the collector quiescent currents by a multiple, the amplifier already operated in class B.

In the case of a very large drive of the amplifier in accordance with FIG. 1, $\Delta I$ increases beyond linearity (in accordance with characteristic a), also in the case of the dimensioning in accordance with the invention. This is because one of the two transistors is then fully turned off so that the exponential characteristic of the other transistor becomes apparent. This effect, which influences both the third and mainly the fifth harmonic, can slightly be reduced in that—as shown in FIG. 3—the two emitter resistors R, which are proportioned in accordance with the invention, are interconnected and that the junction point is connected to ground via a resistor $R_E$ of very small value, which is approximately 1/14 of R. For small collector quiescent currents this dimensioning means that the resistor $R_E$ should have very small values. In order to avoid this the resistor T-network comprising the resistors $R_E$ and R of FIG. 3 may be replaced by an equivalent Pi-network (FIG. 4). The emitter electrodes of the two transistors are then connected directly to ground via resistors R' and are interconnected via a resistor $R_E'$. The values of the resistors $R'$ should then be approximately 0.64 $U_T/I_{CO}$, while $R_E'$ should be approximately $9U_T/I_{CO}$.

It is to be noted that in the case of large drive signals these two circuits, in addition to the desired difference current, produce a common mode wave of twice the frequency as a result of the varying sum current. However, this can be eliminated by a transformer or differential amplifier which amplifies the collector signals.

As previously stated, the circuit arrangement of FIG. 1 produces no even harmonics in the case of symmetrical design. This implies that the transistors 1 and 2 should have identical characteristics (which can be achieved by the use of integrated circuit technology) and that the two emitter resistors R are identical. If these requirements cannot be met, an arrangement in accordance with FIG. 5 may be used. The emitter electrodes of the transistors 1 and 2 respectively are then connected to ground via the series connection of two resistors 10 and 11, and 12 and 13 respectively. The resistors 11 and 13, which are connected directly to ground, have small values in comparison with the resistors 10 and 12, which are connected to the emitter electrodes. Between the connection points of the resistors 10 and 11 on the one hand and 12 and 13 on the other hand, a potentiometer 14 is connected whose wiper is connected to ground. By adjusting the wiper circuit asymmetries can be at least partly compensated.

What is claimed is:

1. An amplifier arrangement comprising, first and second transistors each having an emitter, base and collector electrode, a pair of input terminals coupled to the base electrodes of the transistors for applying an input signal thereto in phase opposition, a pair of signal output terminals coupled to the collector electrodes of the first and second transistors, and a symmetrical resistor network connecting the emitter electrodes of the transistors to a point of constant potential, said resistor network being proportioned so that the slope of each of said first and second transistors is smaller than the value $I_{CO}/U_T$ by a factor a, where $I_{CO}$ is the collector quiescent current of a transistor, $U_T$ is the thermal voltage, and a is a factor between 0.47 and 0.78.

2. An amplifier arrangement as claimed in claim 1 wherein the factor a is approximately 0.64.

3. An amplifier arrangement as claimed in claim 1 wherein said resistor network comprises first and second resistors respectively connected between the emitters of the first and second transistors and the point of constant potential, each resistor having a resistance value which is approximately 0.56 $U_T/I_{CO}$.

4. An amplifier arrangement as claimed in claims 1 or 2 wherein said resistor network comprises two resistors connected in series between the emitters of the first and second transistors, each resistor having a resistance value which is approximately 0.56 $U_T/I_{CO}$, and means connecting a common connection point between said resistors to the point of constant potential via a third resistor having a resistance value which is approximately 0.04 $U_T/I_{CO}$.

5. An amplifier arrangement as claimed in claims 1 or 2 wherein said resistor network comprises, first and second resistors connected between the emitter electrodes of the first and second transistors, respectively, and the point of constant potential with each resistor having a resistance value of approximately 0.64 $U_T/I_{CO}$, and a third resistor having a resistance value of approximately 9 $U_T/I_{CO}$ connected between the emitter electrodes of the first and second transistors.

6. An amplifier arrangement as claimed in claims 1 or 2 wherein said resistor network comprises, first and second resistors connected in series between the emitter electrode of the first transistor and the point of constant potential with the sum of the resistance values being approximately 0.56 $U_T/I_{CO}$, third and fourth resistors connected in series between the emitter electrode of the second transistor and the point of constant potential with the sum of the resistance values being approximately 0.56 $U_T/I_{CO}$, in each series connection the series resistor which is connected to the point of constant potential having a resistance value substantially smaller than that of its other series connected resistor, and a potentiometer connected between a junction point of the first and second resistors and a junction point of the third and fourth resistors and having a wiper connected to the point of constant potential.

7. An amplifier arrangement as claimed in claim 1 wherein the factor a is limited to the range of values between 0.57 and 0.70 and the input terminals are intended to be connected to a low impedance signal source.

8. An amplifier arrangement as claimed in claims 1, 3 or 7 further comprising a transformer for coupling the input terminals to the base electrodes of the first and second transistors and comprising, a primary winding coupled to the input terminals, and a secondary winding having first and second end terminals coupled to the base electrodes of said first and second transistors, respectively, and a center tap coupled to said point of constant potential.

9. An amplifier arrangement as claimed in claim 8 further comprising a capacitor for coupling said center tap to said point of constant potential.

10. An amplifier arrangement as claimed in claim 1 wherein said resistor network comprises first and second resistors connected between the emitter electrodes of the first and second transistors, respectively, and the point of constant potential with each resistor having substantially the same resistance value in the range of values between 0.28 $U_T/I_{CO}$ and 1.12 $U_T/I_{CO}$.

11. An amplifier arrangement as claimed in claim 1 wherein said resistor network comprises, first and second resistors connected in series between the emitter electrodes of the first and second transistors with each resistor having a resistance value in the range of values between 0.28 $U_T/I_{CO}$ and 1.12 $U_T/I_{CO}$, and a third resistor having a resistance value approximately 1/14 the resistance value of the first and second resistors and connected between a common point of said first and second resistors and said point of constant potential.

* * * * *